United States Patent
Jespersen

(10) Patent No.: US 9,383,390 B2
(45) Date of Patent: Jul. 5, 2016

(54) AC OR DC POWER TRANSMISSION SYSTEM AND A METHOD OF MEASURING A VOLTAGE

(75) Inventor: Per Jespersen, Holte (DK)

(73) Assignee: POWERSENSE A/S, Holte (DK)

( * ) Notice: Subject to any disclaimer, the term of this patent is extended or adjusted under 35 U.S.C. 154(b) by 378 days.

(21) Appl. No.: 13/980,844

(22) PCT Filed: Jan. 17, 2012

(86) PCT No.: PCT/EP2012/050615
§ 371 (c)(1),
(2), (4) Date: Nov. 6, 2013

(87) PCT Pub. No.: WO2012/098099
PCT Pub. Date: Jul. 26, 2012

(65) Prior Publication Data
US 2014/0049249 A1    Feb. 20, 2014

(30) Foreign Application Priority Data
Jan. 21, 2011  (EP) ..................... 11151637

(51) Int. Cl.
G01R 15/24    (2006.01)
(52) U.S. Cl.
CPC .............. G01R 15/242 (2013.01); G01R 15/24 (2013.01); G01R 15/247 (2013.01)
(58) Field of Classification Search
CPC ..... G01R 15/24; G01R 15/242; G01R 15/247
USPC ......................................................... 324/97
See application file for complete search history.

(56) References Cited

U.S. PATENT DOCUMENTS

| 4,002,975 A | 1/1977 | Erickson et al. |
|---|---|---|
| 4,253,061 A | 2/1981 | Ono et al. |

(Continued)

FOREIGN PATENT DOCUMENTS

| CA | 2289736 | 9/1998 |
|---|---|---|
| CN | 1255199 | 5/2000 |

(Continued)

OTHER PUBLICATIONS

International Search Report on corresponding PCT application (PCT/EP2012/050615) from International Searching Authority (EPO) dated Feb. 28, 2012.

(Continued)

Primary Examiner — Arleen M Vazquez
Assistant Examiner — Robert P Alejnikov, Jr.
(74) Attorney, Agent, or Firm — Klein, O'Neill & Singh, LLP

(57) ABSTRACT

The present invention relates to an AC or DC power transmission system. The system comprises a first electrical conductor, a second electrical conductor and an insulating space there between. The system further comprises an electric field measurement device comprising the following components being mounted in optical continuation: a first optical fiber being connected to a light source, a first optical lens, a circular polarization filter, a crystal rod having electro-optical properties, a linear polarization filter, a second optical lens, and a second optical fiber being connected to a light detection unit. The electric field measurement device is located adjacent the first electrical conductor and defines a first minimum distance between the crystal rod and the first electrical conductor and a second minimum distance between the crystal rod and the second electrical conductor. The second minimum distance is at least 10 times larger than the first minimum distance.

18 Claims, 11 Drawing Sheets

(56) References Cited

U.S. PATENT DOCUMENTS

| | | | |
|---|---|---|---|
| 4,269,483 | A | 5/1981 | Feldtkeller |
| 5,029,273 | A | 7/1991 | Jaeger |
| 5,635,831 | A | 6/1997 | Englund |
| 5,850,140 | A | 12/1998 | Tokano et al. |
| 6,285,182 | B1 | 9/2001 | Blake et al. |
| 6,307,666 | B1 | 10/2001 | Davidson et al. |
| 6,353,494 | B1* | 3/2002 | Hamada ................ G01R 15/24 324/72 |
| 6,380,725 | B1 | 4/2002 | Chavez et al. |
| 6,388,434 | B1 | 5/2002 | Davidson et al. |
| 6,411,077 | B1 | 6/2002 | Sone et al. |
| 6,492,800 | B1* | 12/2002 | Woods ................ G01R 1/071 324/96 |
| 6,946,827 | B2 | 9/2005 | Rahmatian et al. |
| 7,057,792 | B2 | 6/2006 | Kadogawa et al. |
| 7,769,250 | B2 | 8/2010 | Duvillaret et al. |
| 2003/0117126 | A1* | 6/2003 | Rahmatian ........... G01R 15/241 324/96 |
| 2006/0232260 | A1 | 10/2006 | Bjorn |
| 2008/0164864 | A1* | 7/2008 | Bjorn ................ G01R 15/246 324/96 |
| 2010/0264904 | A1* | 10/2010 | Wu ....................... G01R 31/308 324/97 |

FOREIGN PATENT DOCUMENTS

| | | |
|---|---|---|
| CN | 1419129 | 5/2003 |
| EP | 0011110 | 5/1980 |
| EP | 0338542 | 10/1989 |
| GB | 1353543 | 5/1974 |
| JP | 61-178669 | 8/1986 |
| JP | 03044563 | 2/1991 |
| JP | 10132864 | 5/1998 |
| JP | 2005315815 | 11/2005 |
| JP | 2010044084 | 2/2010 |

OTHER PUBLICATIONS

Written Opinion on corresponding PCT application (PCT/EP2012/050615) from International Searching Authority (EPO) dated Feb. 28, 2012.

Luo, Sunan; "Research on Combined Optical Voltage & Current Transformer"; Huazhong University of Science and Technology; Wuhan, Hubei, P.R.China; Dec. 2000.

Chavez et al.; "230kV Optical Voltage Transducer Using a Distributed Optical Electric Field Sensor System"; IEEE; 2001.

Office Action on corresponding foreign application (JP Application No. 2013-549788) from the Japanese Patent Office dated Sep. 29, 2015.

* cited by examiner

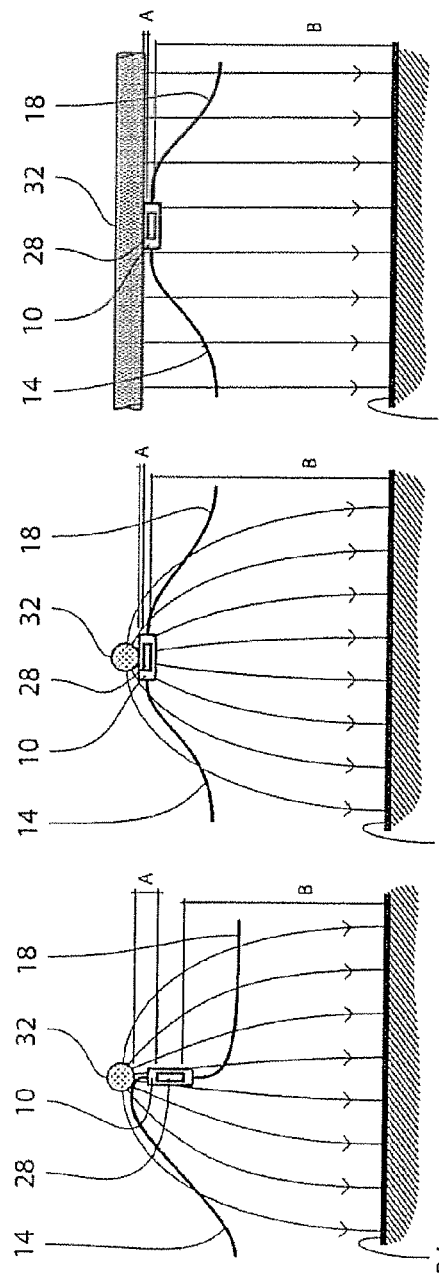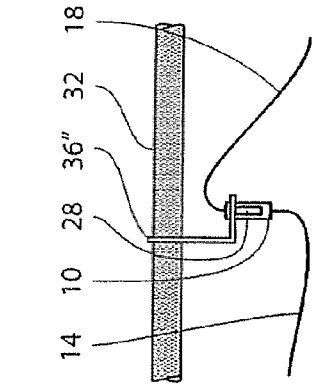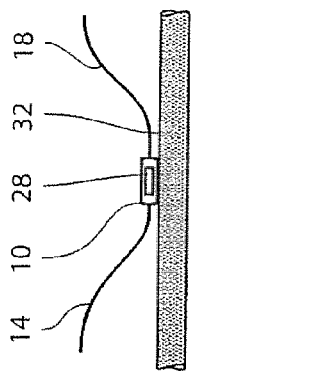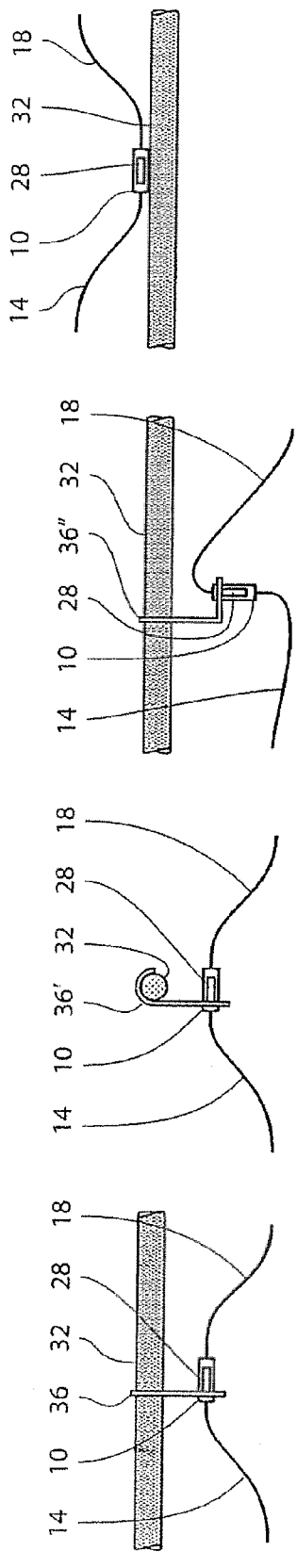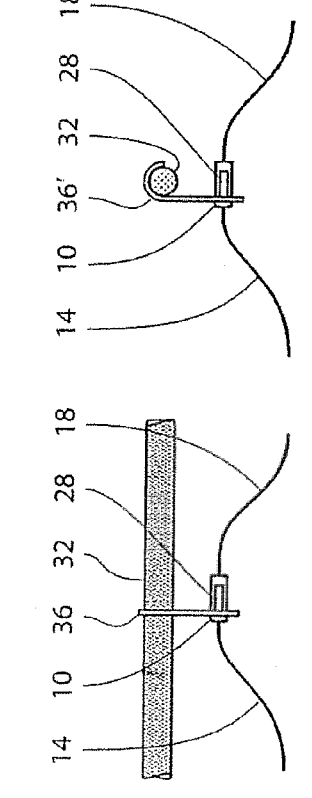
FIG. 2A  FIG. 2B  FIG. 2C  FIG. 2D  FIG. 2E  FIG. 2F  FIG. 2G

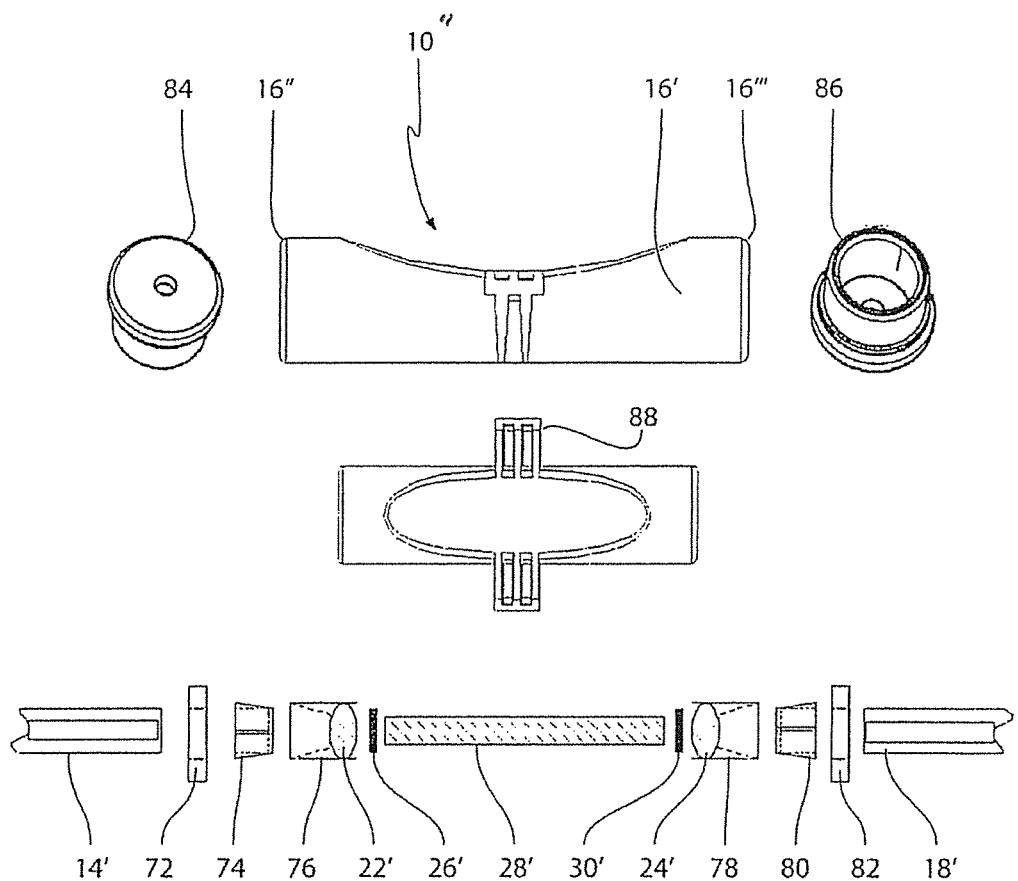
FIG. 6A
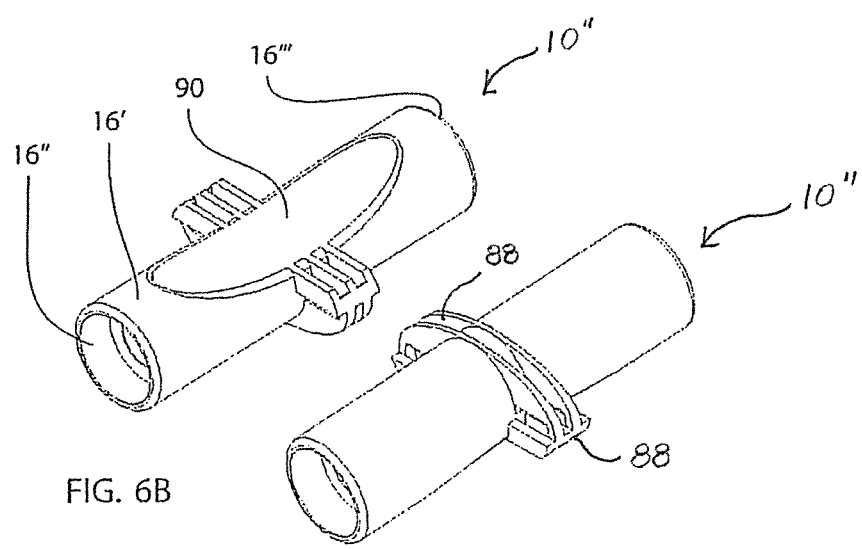
FIG. 6B
FIG. 6C

AC OR DC POWER TRANSMISSION SYSTEM AND A METHOD OF MEASURING A VOLTAGE

CROSS-REFERENCE TO RELATED APPLICATION

This application is a national phase filing, under 35 U.S.C. §371(c), of International Application No. PCT/EP2012/050615, filed on Jan. 17, 2012, the disclosure of which is hereby incorporated by reference in its entirety.

FEDERALLY SPONSORED RESEARCH OR DEVELOPMENT

Not Applicable

BACKGROUND

The present invention relates to an AC or DC power transmission system, a method of measuring a voltage and a method of calibrating a voltage measurement system.

The power industry has a need for monitoring the condition of power transmission systems. For these purposes, it has been known to make current measurements using only optical technology. One example of such optical current sensors utilizing the Faraday effect is described in the applicant's own international application WO/2004/099798. In a Faraday effect current sensor, the polarization plane of a polarized incident light undergoes a rotation, which is a function of the magnetic field created by the electric current to be measured. Such Faraday effect current sensors have the advantage over generally known Rogowski coils and similar metallic current sensors that they may be constructed entirely from dielectric materials and may thus be applied in locations where a very high electric field is present.

It has also been known to carry out voltage measurements using an optical sensor. This may be achieved by utilizing the Pockels effect, which is an optical effect in anisotropic crystals. In a voltage sensor utilizing the Pockels effect, the polarization plane of incident light passing through the crystal undergoes a rotation if there is an electric field applied over it. The main principle of such Pockels effect voltage sensors thus resembles the principle of the above mentioned Faraday effect current sensor, namely that the induced electric field over the sensor element gives rise to a small variation in the polarization of the light going through the sensor. This variation can be measured and from such measurements the electric field strength may be derived. From the derived electric field strength at the location of the sensor, the voltage on the wire may be determined.

There are several advantages of using an optical voltage sensor, the first being simplicity. The optical voltage sensor is comprised of few parts and hence is easy to assemble. Further, the measured signal is solely optical so that there is no electrical noise induced in the measurement. Yet further, there is no electrical connection between the conductor to be measured and the ground like in a conventional voltage divider. Such electrical connection may cause problems such as a short circuit.

The physics behind the optical voltage sensor is based on the Pockels effect, which was discovered in the late 19th century. It has since been used in various known optical devices such as Q-switches and Chirped pulse amplification. The effect is expressed in the linear term of the following equation:

$$\frac{1}{n} = \frac{1}{n_0} + rE + RE^2$$

wherein E is the electric field. n, $n_0$, r and R are all tensors, respectively describing the refractive index, the ordinary refractive index, the linear and quadratic electro-optic coefficient. If E is applied correctly with respect to the r tensor (the crystal) and the quadratic term is neglected, n will become non-symmetric, thus giving rise to birefringence. This means that light sees a different refractive index depending on the orientation of the polarization with respect to the r tensor.

In known optical voltage sensors, the crystals which exhibit the Pockels effect have electrodes attached to them and have a predetermined trajectory for light passing through. The above configuration is generally known as a Pockels cell and functions as a voltage-controlled wave plate. Such configurations are used in various prior art publications. One example includes an IEEE publication titled "230 kV Optical Voltage Transducer Using a Distributed Optical Electric Field Sensor System" by P. P. Chavez, F. Rahmatian and N. A. F. Jaeger. The proposed sensor system uses a Pockels effect crystal located within an insulating section between line voltage and ground. The full line voltage thus is applied over the Pockels cell, which at least for medium voltage and above requires a high insulation level.

U.S. Pat. No. 6,285,182 discloses an electro-optic voltage sensor having no need for a ground reference. However, the voltage sensor still needs metallic electrodes in the vicinity of the Pockels crystal. EP 0338542 discloses a similar electro-optic voltage sensor using a Pockels sensor and capacitive voltage divider located within a common housing. Thus, only AC voltage is measureable.

Further prior art describing the use of Pockels cells voltage sensors located within an insulating section for measuring the voltage on high voltage lines, or similar technologies, are among others: U.S. Pat. Nos. 6,380,725, 5,029,273, 5,635,831, 6,388,434, 6,946,827, 6,411,077, JP 10132864, WO2009/138120, U.S. Pat. Nos. 4,269,483, 6,492,800, 7,769,250, 7,057,792, 6,353,494, JP 2005315815, JP 03044563, WO00/13033, EP 0011110, U.S. Pat. No. 4,253,061, WO98/13698, CA 2,289,736 and GB 1353543.

Using a conventional Pockels cell configuration as described above has the disadvantage that metallic electrodes need to be attached adjacent the crystal within the voltage sensor. For high voltage or medium voltage purposes, this necessitates a large amount of insulation, resulting in a very large voltage sensor. Further, since metallic objects are located wihtin a high electric field, there is a risk of insulation failure and a dielectric breakdown within the voltage sensor. Such dielectric failures would result in the immediate failure of the voltage sensor and possibly in an interruption of the power transmission system. It would therefore be an advantage to have a voltage sensor with no electrodes attached to the crystal. Thus, it is the object of the present invention to provide methods and systems for measuring the voltage of a conductor without the involvement of any metallic materials other than the conductor itself.

SUMMARY

The above need and the above object together with numerous other needs and objects, which will be evident from the below detailed description, are according to a first aspect of the present invention obtained by an AC or DC power transmission system comprising a first electrical conductor, a second electrical conductor and an insulating space between the first electrical conductor and the second electrical conductor, the power transmission system further comprising an electric field measurement device, the electric field measurement device comprising:

a housing made of dielectric material and defining a first open end and a second open end opposite the first open end, a first optical fibre being connected to a light source, a first optical lens being mounted in the housing at the first open end and in optical continuation of the a first optical fibre, a circular polarization filter mounted in the housing in optical continuation of the first optical lens, a crystal rod received in and encapsulated within the housing in optical continuation of the circular polarization filter, the crystal rod being made of a material having electro-optical properties, a linear polarization filter mounted in the housing in optical continuation of the crystal rod, preferably oriented 45° relative to the induced optical axis of the crystal rod, a second optical lens mounted in the housing at the second open end in optical continuation of the linear polarization filter, and a second optical fibre in optical continuation of the second optical lens, the second optical fibre being connected to a light detection unit, the electric field measurement device being located adjacent the first electrical conductor within the insulating space and defining a first minimum distance between the crystal rod and the first electrical conductor and defining a second minimum distance between the crystal rod and the second electrical conductor, the second minimum distance being at least 10 times larger than the first minimum distance, such as 100 times, preferably 1,000 times, more preferred 10,000 times, most preferred 100,000 times.

In the present context, the applicant has surprisingly found that even if the ground reference is located remote from the energized conductor, the electric field strength in a very close proximity to the conductor is sufficient to produce a measurable retardance in a crystal exhibiting the Pockels effect. The present system has the additional advantage over some prior art systems that both AC and DC may be measured. The magnitude of the intended current of the power transmission system is typically at least from a few Amperes up to several hundreds or thousands of Amperes.

The electric field measurement device may constitute a voltage sensor for measuring the voltage of the first electrical conductor relative to the second electrical conductor. The insulating space between the first electrical conductor and the second electrical conductor may be constituted by a gas such as air, or a solid insulator such as an insulator made of glass, porcelain or polymeric materials.

The housing of the electric field measurement device is typically made of polymeric material such as plastic. It should preferably be opaque to prevent any ambient light from the outside to influence the measurement. The light source is typically constituted by a light-emitting diode or laser which is optically connected to the first optical lens by the first optical fibre. The optical fibre ensures that no substantial amount of light is lost between the light source and the first optical lens. In this way, the light source may be located at a distant location, i.e. in a voltage measurement module easily accessible to maintenance staff. The first optical lens is used for collimating all of the incoming light from the first optical fibre towards the circular polarization filter. The circular polarization filter causes the incoming light to be circularly polarized before entering the crystal rod. The crystal rod has electro-optical properties exhibiting the Pockels effect so that when the crystal rod is exposed to an electric field, the incoming light experiences retardance. Depending on how the crystal is cut and the direction of the incoming light, the crystal may be oriented in any direction relative to the electric field emitted by the first conductor and generated by the current. Typically, however, the crystal will be oriented either parallel or perpendicular to the electric field from the first electrical conductor. The length of the crystal rod is typically between 5 mm and 20 mm. The material used may be e.g. KD*P (DKDP, potassium dideuterium phosphate). When leaving the crystal rod, and in case an electric field is applied, the outgoing light has been retarded so that the circular polarization is turned into elliptical polarization. A last linear polarization filter is typically oriented at 45° to the induced optical axis in the crystal rod, which means parallel or perpendicular to the major axis of the ellipse. The amplitude of the light leaving the linear polarization filter thus corresponds to the electric field strength at the location of the crystal rod. The value of the electric field strength at the location of the crystal rod may be translated into a voltage of the first conductor. Since the linear polarization filter will allow 50% of the light to pass when the first conductor is grounded, i.e. the light leaving the crystal rod remains circularly polarized, positive and negative voltages may be distinguished as either an increase or a decrease in light. The light leaving the linear polarization filter is collected by a second optical lens and via a second optical fibre led to a light detection unit detecting the light intensity of the light leaving the optical voltage sensor. The relative value of the light emitted by the light source and the light detected by the light detection unit corresponds to the voltage of the first conductor.

The crystal rod of the electric field measurement device should be positioned in a fixed position close to the first conductor. The electric field measurement device should be placed in a position exhibiting an electric field, such as between a power line and the ground, and not encapsulated inside the first conductor, between two conductors exhibiting the same electrical potential or within a metallic object. For high accuracy, the distance between the crystal rod and the first conductor should be as small as possible. The minimum distance between the crystal rod and the second electrical conductor should exceed the distance between the crystal rod and the first electrical conductor at least 10 times, preferably 100 times or more.

In a further embodiment according to the first aspect, the first electrical conductor comprises an overhead line or a metallic object electrically connected to an overhead line. The sensor may be placed either close to a metal plate of the same potential as the conductor of interest or on the conductor itself. The conductor is typically an overhead line.

In a further embodiment according to the first aspect, the second electrical conductor comprises a metallic object being insulated in relation to the first electrical conductor. The second conductor may be e.g. a power line having a voltage, frequency or phase angle different from the first conductor.

In a further embodiment according to the first aspect, the second electrical conductor constitutes the ground. Further, the second conductor may constitute a ground reference such as a metallic pylon supporting one or more power lines, or the ground surface below an overhead line.

In a further embodiment according to the first aspect, the first electrical conductor of the power transmission system has a rated voltage of between 0.1 kV and 1000 kV, preferably between 1 kV and 500 kV, more preferred between 5 kV and 100 kV, most preferred between 10 kV and 50 kV. The power transmission system is intended for power transmission voltages of at least 0.1 kV and above. Typical power transmission voltages range between 1 kV and 500 kV for both AC and DC.

In a further embodiment according to the first aspect, the crystal rod is being exposed to an effective electric field strength of between $1*10^4$ V/m and $1.2*10^8$ V/m, preferably between $1*10^5$ V/m and $1.2*10^7$ V/m, when the power transmission system is being operated at its rated voltage. The above ranges define typical electric field strengths within which the present voltage sensor is capable of delivering accurate measurements.

In a further embodiment according to the first aspect, the first minimum distance is between 0.1 mm and 100 mm, preferably between 1 mm and 10 mm. For high accuracy of the voltage measurement, the voltage sensor should be positioned as close as possible to the first conductor, where the electric field strength is high in comparison to a more distant location.

In a further embodiment according to the first aspect, the second minimum distance is between 0.1 m and 100 m, preferably between 1 m and 10 m. The voltage sensor should be positioned as far as possible from the second conductor in order to have no influence on the voltage measurement. The second conductor may, as explained above, be constituted by another power line, the ground, or a grounded object.

In a further embodiment according to the first aspect, the light path through the crystal rod is oriented substantially parallel to the electric field at the first conductor, or alternatively, the light path through the crystal rod is oriented substantially perpendicular to the electric field at the first conductor. By orienting the crystal rod substantially perpendicular to the electric field, the crystal rod may be positioned closer to the conductor. However, by orienting the crystal rod substantially parallel to the electric field, a smaller and thus less complex and less costly crystal may be used.

In a further embodiment according to the first aspect, the circular polarization filter consists of a quarter-wave plate and a linear polarizer. In a preferred embodiment, the linear polarizer and the quarter-wave plate are made from a single sheet in order to minimize light losses. Alternatively, the linear polarizer and the quarter-wave plate constitute two separate parts. The linear polarizer and the quarter-wave plate should be oriented in such a way that the light first enters the linear polarizer and subsequently the quarter-wave plate.

In a further embodiment according to the first aspect, the crystal rod, preferably made of potassium phosphate, exhibits the Pockels effect. Potassium phosphate is a preferred material as it exhibits a high birefringence when applying an electric field, which is characteristic of the Pockels effect.

In a further embodiment according to the first aspect, the electric field measurement device further comprises:
  a first sealing means for sealing the first end of the housing, the first sealing means having an aperture for receiving the first optical fibre,
  a first fixture means for fixing the first optical fibre to the housing,
  a first reception part being attached to the first optical lens and adapted for receiving the first fixture means,
  a second fixture means for fixing the second optical fibre to the housing,
  a second reception part being attached to the second optical lens and adapted for receiving the second fixture means,
  a second sealing means for sealing the second end of the housing, the second sealing means having an aperture for receiving the second optical fibre, and
  a first and a second lid fixed to the first and second end, respectively, of the housing, the first and second lids including an aperture for receiving the first and second optical fibre, respectively. By using a fixture means for fixing the optical fibre and a reception part attached to the optical lens for receiving the fixture means, the optical fibre may be optimally positioned with respect to the optical lens when assembling the optical voltage sensor in the field without access to high precision equipment. In this way, the loss of light intensity may substantially be avoided. Further, the sealing means and the lids prevent moisture from entering the housing, making the optical voltage sensor weather-proof.

In a further embodiment according to the first aspect, the housing is made of polymeric material, such as plastic. Plastic is preferred since it is durable and constitutes a dielectric material which does not influence the electric field. Further, plastic may be made essentially opaque for preventing any ambient light from entering the crystal rod, thereby disturbing the measurement results.

The above need and the above object together with numerous other needs and objects, which will be evident from the detailed description below, are according to a first aspect of the present invention obtained by a method of measuring a voltage of a first electrical conductor in relation to a second electrical conductor spaced apart from the first electrical conductor by an insulating space, the method comprising providing an electric field measurement device, the electric field measurement device comprising:
  a housing made of dielectric material and defining a first open end and a second open end opposite the first open end,
  a first optical fibre being connected to a light source,
  a first optical lens being mounted in the housing at the first open end and in optical continuation of the first optical fibre,
  a circular polarization filter mounted in the housing in optical continuation of the first optical lens,
  a crystal rod received in and encapsulated within the housing in optical continuation of the circular polarization filter, the crystal rod being made of a material having electro-optical properties for causing retardance,
  a linear polarization filter mounted in the housing in optical continuation of the crystal rod,
  a second optical lens mounted in the housing at the second open end in optical continuation of the linear polarization filter, and
  a second optical fibre in optical continuation of the second optical lens, the second optical fibre being connected to a light detection unit, the method further comprising the following steps:
  positioning the electric field measurement device adjacent the first electrical conductor within the insulating space so that a first minimum distance defined between the crystal rod and the first electrical conductor is at least 10 times larger than a second minimum distance defined between the crystal rod and the second electrical conductor, such as 100 times, preferably 1000 times, more preferred 10,000 times, most preferred 100,000 times, and
  detecting a relative retardance between light emitted by the light source and light detected by the light detection unit.

The above need and the above object together with numerous other needs and objects, which will be evident from the detailed description below, are according to a first aspect of the present invention obtained by a method of calibrating an electric field measurement device included in a power transmission system, the power transmission system comprising a first electrical conductor having a known voltage, a second electrical conductor having another known voltage and an insulating space between the first electrical conductor and the second electrical conductor, the electric field measurement device comprising:

a housing made of dielectric material and defining a first open end and a second open end opposite the first open end, a first optical fibre being connected to a light source, a first optical lens being mounted in the housing at the first open end and in optical continuation of the first optical fibre, a circular polarization filter mounted in the housing in optical continuation of the first optical lens, a crystal rod received in and encapsulated within the housing in optical continuation of the circular polarization filter, the crystal rod being made of a material having electro-optical properties for causing retardance, a linear polarization filter mounted in the housing in optical continuation of the crystal rod, a second optical lens mounted in the housing at the second open end in optical continuation of the linear polarization filter, and a second optical fibre in optical continuation of the second optical lens, the second optical fibre being connected to a light detection unit, the electric field measurement device being located adjacent the first electrical conductor within the insulating space and defining a first minimum distance between the crystal rod and the first electrical conductor and defining a second minimum distance between the crystal rod and the second electrical conductor, the second minimum distance being at least 10 times larger than the first minimum distance, such as 100 times, preferably 1000 times, more preferred 10,000 times, most preferred 100,000 times, the method comprising the steps of:

detecting a relative retardance between light emitted by the light source and light detected by the light detection unit, and calculating a calibration constant based on the relative retardance and the known voltages.

It is evident from the above that the methods according to the second and/or third aspects may be used in combination with the system according to the first aspect.

In a preferred embodiment, the insulating space constitutes a gas insulated space, such as a space filled by $N_2$, $SF_6$ or, preferably, atmospheric gas. Typically, the first electrical conductor constitutes an overhead line and the insulated space will consequently constitute atmospheric gas. The electric field measurement device may thus be located adjacent the first electrical conductor without compromising the electrical insulation properties of the insulating space. It is contemplated that other gaseous matter may be used for the insulating space, such as $N_2$ or $SF_6$ insulating gas.

BRIEF DESCRIPTION OF THE DRAWINGS

FIGS. 2A through 2G are diagrammatic views showing various positions of a voltage sensor in accordance with the present disclosure relative to a power line;

FIG. 6A is an exploded view of a second embodiment of a voltage sensor in accordance with the present disclosure;

FIGS. 6B and 6C are top and bottom perspective views, respectively, of the voltage sensor of FIG. 6A.

DETAILED DESCRIPTION OF THE DRAWINGS

Figure 1A:
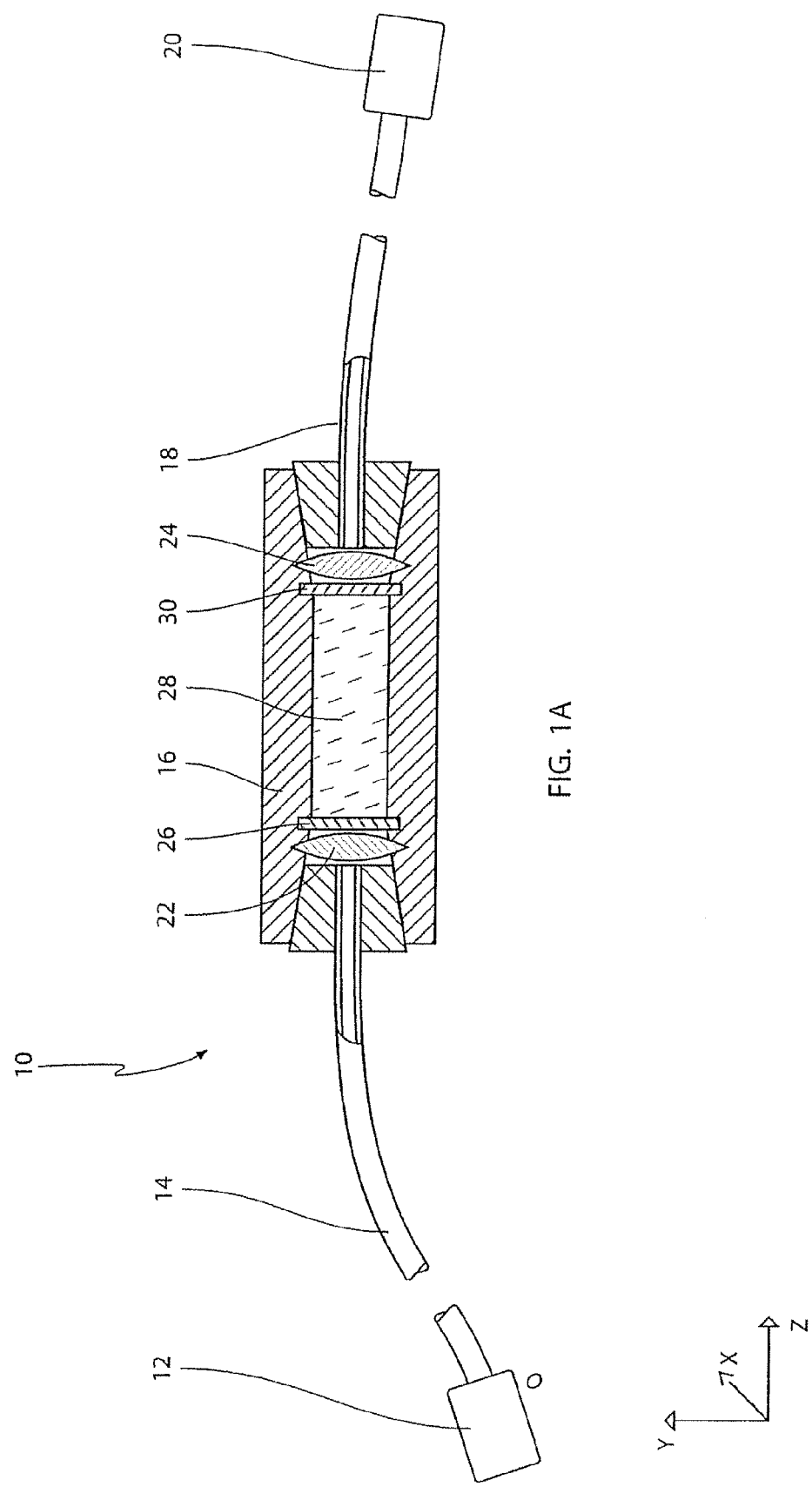
FIG. 1A is a simplified longitudinal cross-sectional view of a first embodiment of an electric field measuring device (voltage sensor) in accordance with the present disclosure.

FIG. 1A shows a cross-sectional view of a first embodiment of an electric field measurement device constituting a voltage sensor 10 according to the present invention. The main principle of the voltage sensor 10 is the Pockels technology. The voltage sensor 10 is basically a phase retarder with a retardance proportional to an applied electric field. The working principle of the voltage sensor 10 is as follows: Light generated by a light source 12, e.g. a laser or LED, is led through a first optical fibre 14 to a sensor housing 16. The sensor housing 16 comprises a plastic casing with the first optical fibre 14 entering at one end of the housing 16 and a second optical fibre 18 leaving the opposite end of the housing 16. The second optical fibre 18 is connected to a photo detector 20, comprising e.g. a photo diode. Both optical fibres 14, 18 couple into respective lenses 22, 24 which collimate the light through the center of the housing 16. In the housing 16, the incoming light is focused by the first lens 22 to pass through the interior components of the voltage sensor 10. The light path is defined as being along the Z-axis. All optical parts of the sensor are placed perpendicular to the light path (hence in the XY-plane). The interior of the housing 16 is comprised of three parts: a sheet constituting a circular polarizer 26, an electro-optical crystal 28 and a linear polarizer 30. The circular polarizer 26 is in turn made up of a linear polarizer and a quarter-wave plate. The light travels through all parts, i.e. all parts are positioned in optical continuation. The circular polarizer 26 is cut from a sheet and must be placed in the sensor so that the light enters first the linear polarizer, then the quarter-wave plate. The circular polarizer 26 makes the incoming light circularly polarized. After passing the circular polarizer 26, the light passes through the electro-optical crystal 28, made of e.g. KD*P (DKDP, potassium dideuterium phosphate), in which the optical axis, induced by the electric field, is arranged in the XY-plane. When subjected to an electric field, the electro-optical crystal 28 causes a change of polarization of the incoming circularly polarized light into elliptically polarized light. Finally, the light passes through a linear polarizing filter 30 oriented at a 45° angle to the induced optical axis of the electro-optical crystal 28. The linear polarizing filter 30 will allow more or less light to pass through, depending on the ellipticity of the polarization of the incoming light, which ellipticity in turn depends on the strength of the electric field subjected to the electro-optical crystal 28.

Figure 1B:
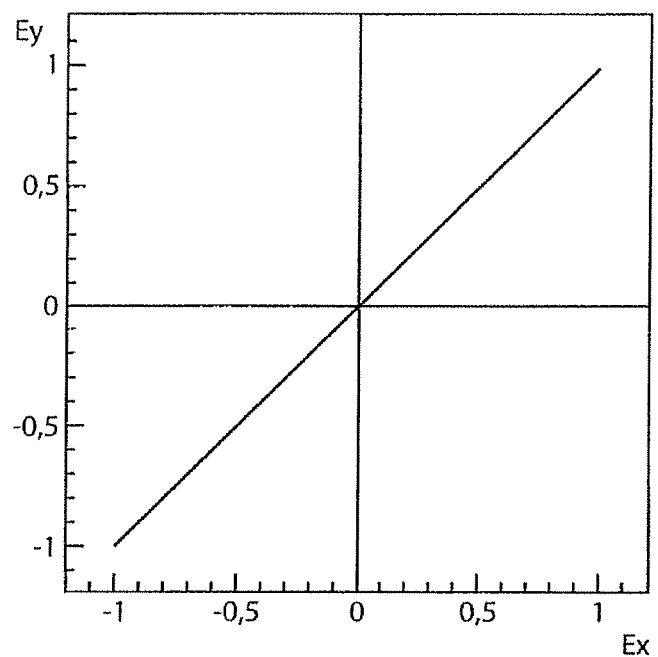
FIGS. 1B through 1F are graphs illustrating the working principle of the voltage sensor of FIG. 1A.

FIG. 1B shows a graph describing the polarization of the light after passing the linear polarizer of the circular polarizer 26 of the voltage sensor 10 of FIG. 1A. Unpolarized light from the light source enters the linear polarizer of the circular polarizer 26 of the voltage sensor 10, which linear polarizer makes the light linearly polarized with an angle of 45° to the x-axis.

Figure 1C:
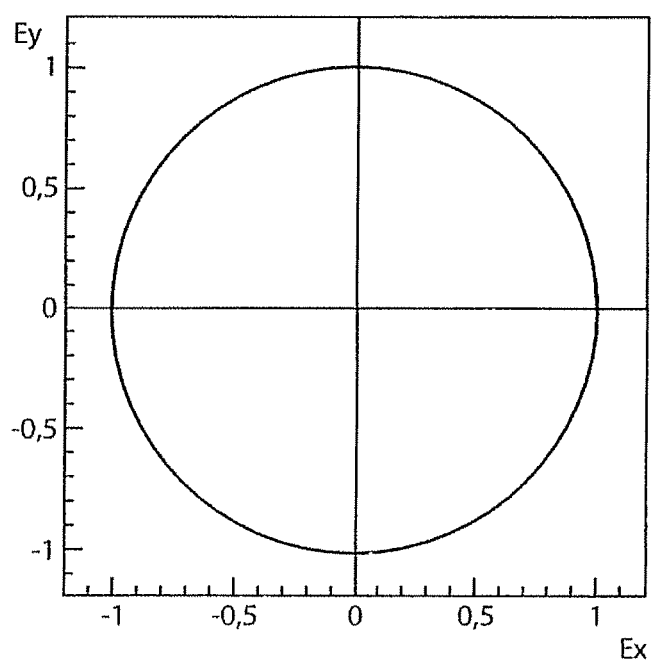

FIG. 1C shows a graph describing the polarization of the light after passing the quarter-wave plate of the circular polarizer 26 of the voltage sensor 10 of FIG. 1A. The quarter-wave plate introduces a 90° phase shift between the light's E-field component along the x-axis and the light's E-field component along the y-axis, thus making the light circularly polarized.

Figure 1D:
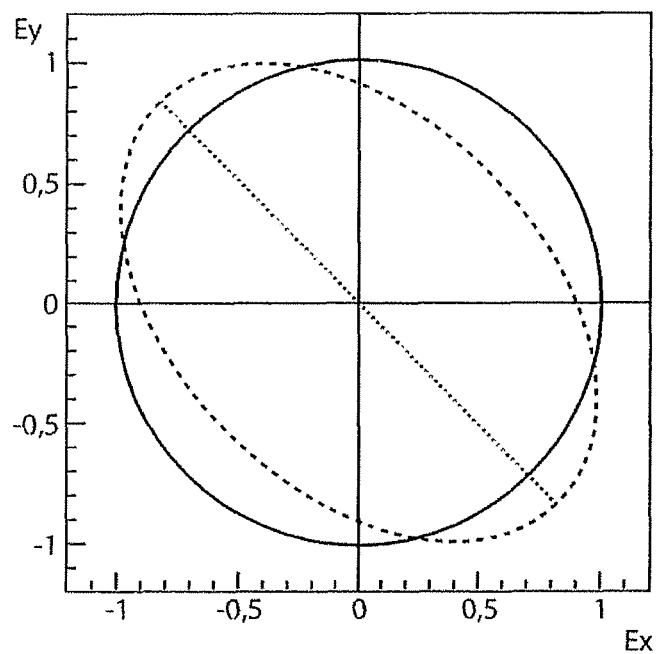
Figure 1E:
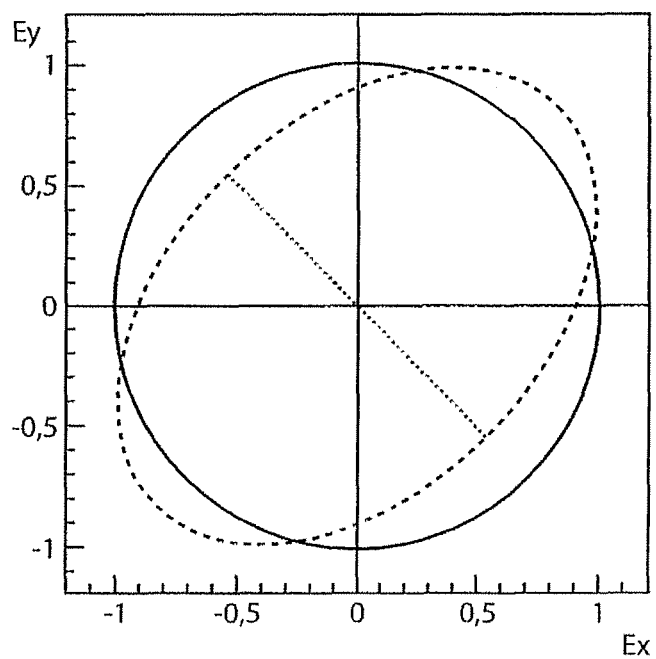

FIGS. 1D and 1E show two respective graphs describing the polarization of the light after passing the electro-optical crystal 28, which have been cut so that when an electric field is applied over the crystal 28, the induced optical axis is in the xy-plane. When the circularly polarized light enters the crystal 28 and an electric field is applied onto the crystal 28, the phase shift between the light's E-field component parallel and perpendicular to the induced optical axis is slightly increased, as shown in FIG. 1D, or slightly decreased, as show in FIG. 1E, depending on the direction of the applied electric field. The circular polarization of the incoming light is thus squeezed from a circle, shown in full, into an ellipse, shown as a dashed line, which ellipse is oriented either 45° or −45° to the optical axis, depending on the direction of the applied field. A higher applied electric field yields a greater ellipticity.

The azimuthal rotation of the crystal with respect to the circular polarizer 26 is inconsequential, as the resulting light's polarization is circular, which is azimuthally symmetric. In effect, a circular polarizer is a 90° phase retarder. The electro-optical crystal, preferably a KD*P crystal, is oriented so that an electric field applied parallel to the light path induces an optical axis perpendicular to the light path. This phenomenon is called Pockels effect. This will induce a phase retardance between linearly polarized light perpendicularly and parallel to this axis:

$$\Delta\varphi = \frac{\pi r n_0^3 V}{\lambda}$$

wherein $\Delta\varphi$ is the difference in phase between light polarized perpendicularly and parallel to the optical axis, r is the linear electro-optical coefficient, $\lambda$, is the vacuum wavelength of the light and V is the electric potential over the crystal. The already circularly polarized light will thus experience a further phase retardance depending on the strength and direction of the electric field. This will make the polarization state of the light elliptical, with the long axis being either 45° or −45° to the optical axis in the crystal as shown in FIGS. 1D and 1E (the induced optical axis is orientated along the y-axis).

The dotted line shown is the state of the light as it exits the sensor, after passing the linear polarizing filter 30. A longer dotted line, as in FIG. 1D, means higher amplitude of the light wave, which in turn means higher light intensity. A shorter dotted line, as in FIG. 1E, means lower amplitude of the light wave, which in turn means lower light intensity. So there is a correlation between the strength and direction of the applied electric field and the resulting light intensity. This variation can be measured by the photo detector, e.g. a light-sensitive diode, and can be translated into the voltage of the conductor to be measured.

The last linear polarizing filter 30, which the light enters subsequent to the crystal 28, is a polarizer oriented at a 45° angle to the induced optical axis. The last polarizer 30 is also cut from a sheet and must be oriented at 45° to the induced optical axis in the crystal 28. In the present case, the filter is rotated 45° counterclockwise. The curve shows the light polarization state after it has passed this last polarizer. If no field is applied over the crystal 28, half of the incident light is allowed through the last filter (under ideal circumstances with no light loss except from polarization effects). If the ellipse is "stretched" along the polarizer, as in FIG. 1D, more than half of the light is allowed through, as indicated by the line. Whereas, if it is "squeezed", less than half the light is allowed through. Hence a higher electric field results in a bigger stretch/squeeze of the ellipse, which gives a higher resulting light variation from half intensity. This is the main principle of the sensor.

In the present context, the half intensity of the incoming light may be designated DC light. The overlying light variation from the polarization effects may be designated AC light, since it is a result of the AC voltage applied to the conductor the potential of which is to be measured. The AC light signal is in the present context very small compared to the DC light signal, and thus the DC light may be filtered away from the total signal in the electronics leaving only the AC light signal. The amplitude of the AC light can then be calibrated so that it translates into the amplitude of the voltage of the conductor the sensor is attached to.

Figure 1F:
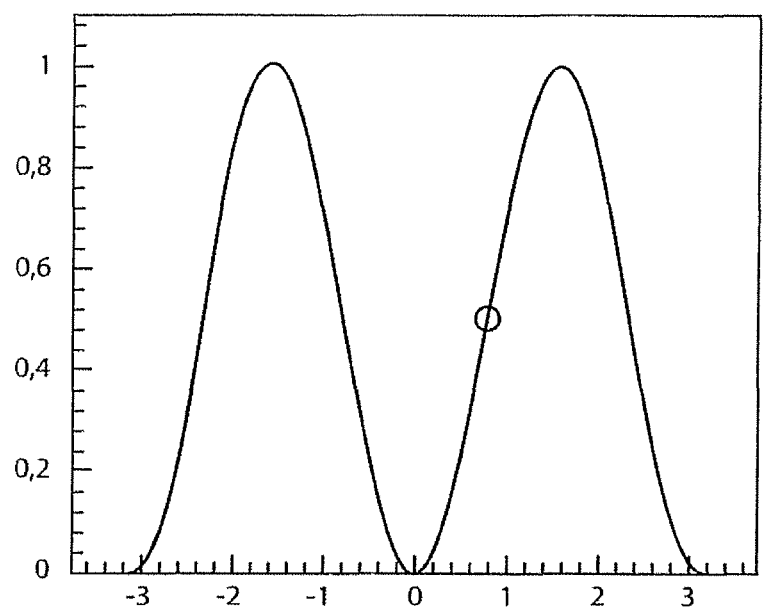

FIG. 1F shows the light intensity as a function of retardance ($I=I_0 \sin^2(\phi)$) of the light after passing the last linear polarizing filter 30 of the voltage sensor 10 of FIG. 1A. The reason for using a circular polarizer instead of just a linear polarizer can be seen when looking at FIG. 1F. If there were no retardance prior to the crystal 28, the variation in intensity, due to the AC field over the crystal 28, would be around zero, which is where the derivative of the intensity function is at its minimum. This would also mean that there is no difference in light intensity between a positive and a negative field, thus making phase determination difficult. By moving the "zero voltage" point to correspond to a 90° retardance bias, two advantages will become apparent: Firstly, there is a obvious difference between positive and negative applied electric fields, and secondly, the function around the "zero voltage", i.e. at the half intensity of the incoming light, is approximately linear, resulting in a maximum sensitivity to retardance variation around the "zero voltage". In the figure, this area has been encircled.

FIG. 2A shows a first embodiment describing a possible positioning of the voltage sensor 10. The voltage sensor 10 is positioned adjacent an overhead line constituting an electrical power line 32, e.g. a high voltage line. The ground is designated the reference numeral 34. The electric field lines are shown between the power line 32 and the ground 34. The electric field must be applied in parallel to the light path through the crystal 28. The voltage sensor 10 is placed so that the electro-optical crystal 28 of the voltage sensor 10 is located as close to the power line 32 as possible. The distance between the electro-optical crystal 28 and the power line 32 has been designated A, and the distance between the optical crystal 28 and the ground 34 has been designated B. The distance B is at least 10 times longer than the distance A. The electric field strength at the crystal 28 adjacent the power line 32 is approximately linear and decreases quadratically to the distance from the power line 32.

FIG. 2B shows a second embodiment describing a possible positioning of the voltage sensor 10. It is also possible to cut the crystal 28 in such a way that both the current path and the field will lie at a 90° angle to the direction of light through the crystal 28. This has the advantage that it is easier to place the crystal close to the power line without the lens and fibre being in the way.

FIG. 2C shows a third embodiment describing a possible positioning of the voltage sensor 10. It is also possible to cut the crystal 28 in such a way that the field will lie at a 90° angle to the direction of light through the crystal 28, while the current path lies parallel to the light through the crystal 28. This embodiment has the advantage that it is easier to place the crystal 28 close to the power line without the lens and fibre being in the way. Also it is easier to boost the sensitivity by increasing the length of the crystal 28.

FIG. 2D shows a fourth embodiment describing a possible positioning of the voltage sensor 10. It resembles FIG. 2C, but further includes a plate 36 for holding the voltage sensor 10. The plate 36 may be made of conducting material, i.e. a metal or a dielectric material such as plastic. Using a metal for the plate causes the plate 36 to assume the same potential as the power line 32. The voltage sensor 10 may be constructed in such a way that the fibre 14 and the lens (not shown here) pass through a hole in the metal plate 36 which has the same electric potential as the conductor. The plate 36 may thus be used for allowing the crystal 28 to be located even closer to the conductor than otherwise possible, thereby minimizing the distance A.

FIG. 2E shows a fifth embodiment describing a possible positioning of the voltage sensor 10. It resembles FIG. 2B, but further includes a plate 36' for holding the voltage sensor 10. The upper part of the plate 36' constitutes a hook-shaped member which is used for grabbing the power line 32, either temporarily or permanently.

FIG. 2F shows a sixth embodiment describing a possible positioning of the voltage sensor 10. It resembles FIG. 2A, but further includes a plate 36" for holding the voltage sensor 10.

FIG. 2G shows a seventh embodiment describing an alternative placement of the voltage sensor 36 above the power line 32. The present embodiment resembles FIG. 2C, but is as such compatible with the other above mentioned embodiments. Since the outwardly projecting electric field lines will, adjacent to the conductor, form a linear field around the conductor 32, it is not required to position the voltage sensor 10 immediately below the power line 32. Any position around and adjacent the conductor 32 is allowable. The electric field lines will initially project outwards, evenly distributed around the conductor, before eventually going towards the ground. Therefore, in the present embodiment, the electric field lines will go upwards through the crystal 28 of the voltage sensor 10 before bending towards the ground.

Figure 3B:
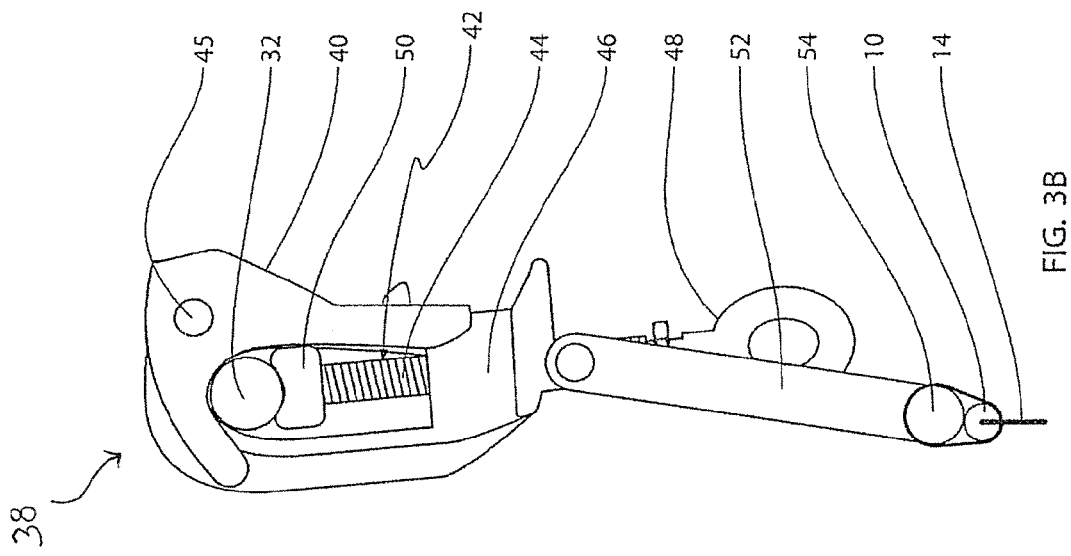
FIG. 3B is a side elevation view of the assembled power line and voltage sensor holder of FIG. 3A.
Figure 3A:
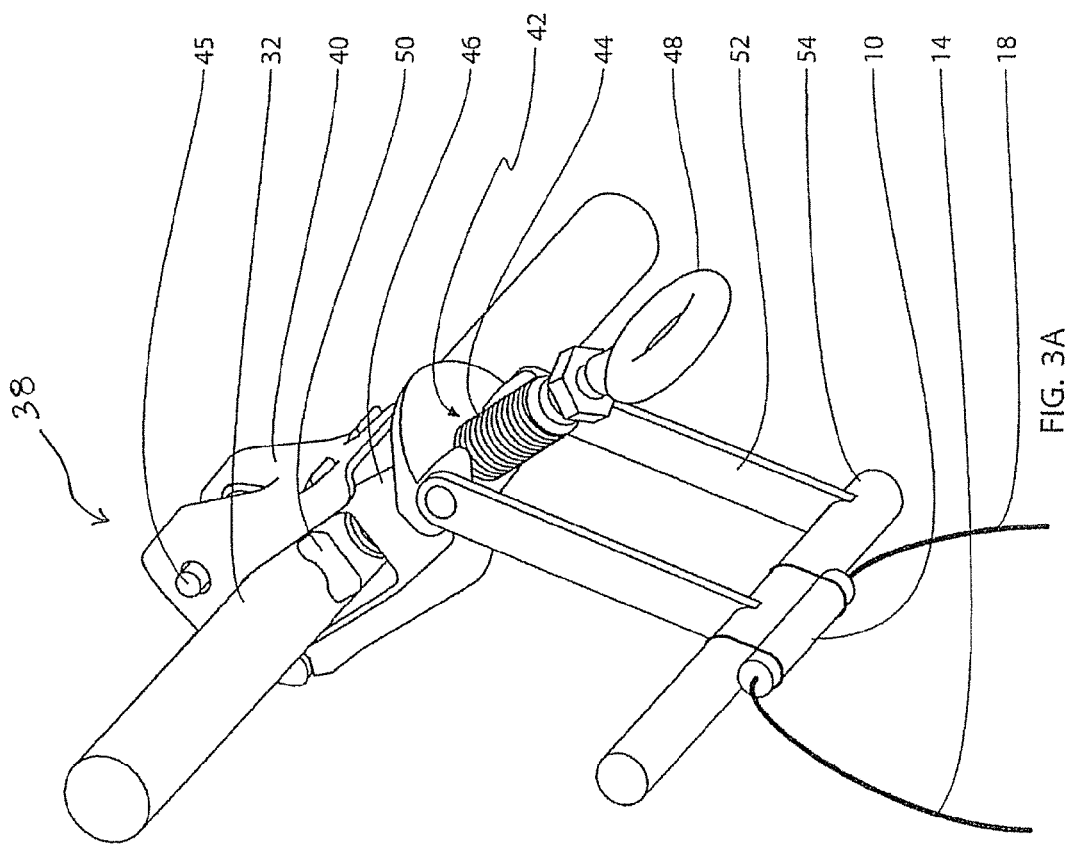
FIG. 3A is a perspective view of an assembled power line and voltage sensor holder in accordance with the present disclosure.

FIG. 3A shows a perspective view of a voltage sensor holder 38 being attached to a power line 32. The power line holder 38 is made of metal and comprises a snap holder 40 and a screw holder 42. The snap holder 40 is held by a hinge 45 and loaded by a spring (not shown). The screw holder 42 comprises a threaded rod 44. The threaded rod 44 is located in a threaded receptacle 46. A handle 48 for turning the threaded rod 44 and thereby either fixing or releasing the screw holder 42 is attached to the end of the threaded rod 44 facing away from the power line 32. A fixation spacer 50 is attached to the end of the threaded rod 44 facing towards the power line 32. The fixation spacer 50 provides a larger fixation area to fix the power line 32 in a secure position. The fixation spacer 50 may preferably be slightly undulated, corresponding to the outer surface of the power line 32. By turning the handle 48 clockwise, the power line 32 may be firmly fixed to the power line holder. Consequently, by turning the handle 48 anticlockwise, the power line 32 may be released.

The voltage sensor holder 38 further comprises an extension 52 and an elongated rod 54 attached to the extension and opposite the remaining part of the voltage sensor holder 32. The voltage sensor 10 is attached to the elongated rod 54. Since the voltage sensor holder 38 is made of metal, the elongated rod will have the same potential as the power line 32.

FIG. 3B shows a side view of a voltage sensor holder 38 being attached to a power line 32, similar to the already shown holder of FIG. 3A.

Figure 4:
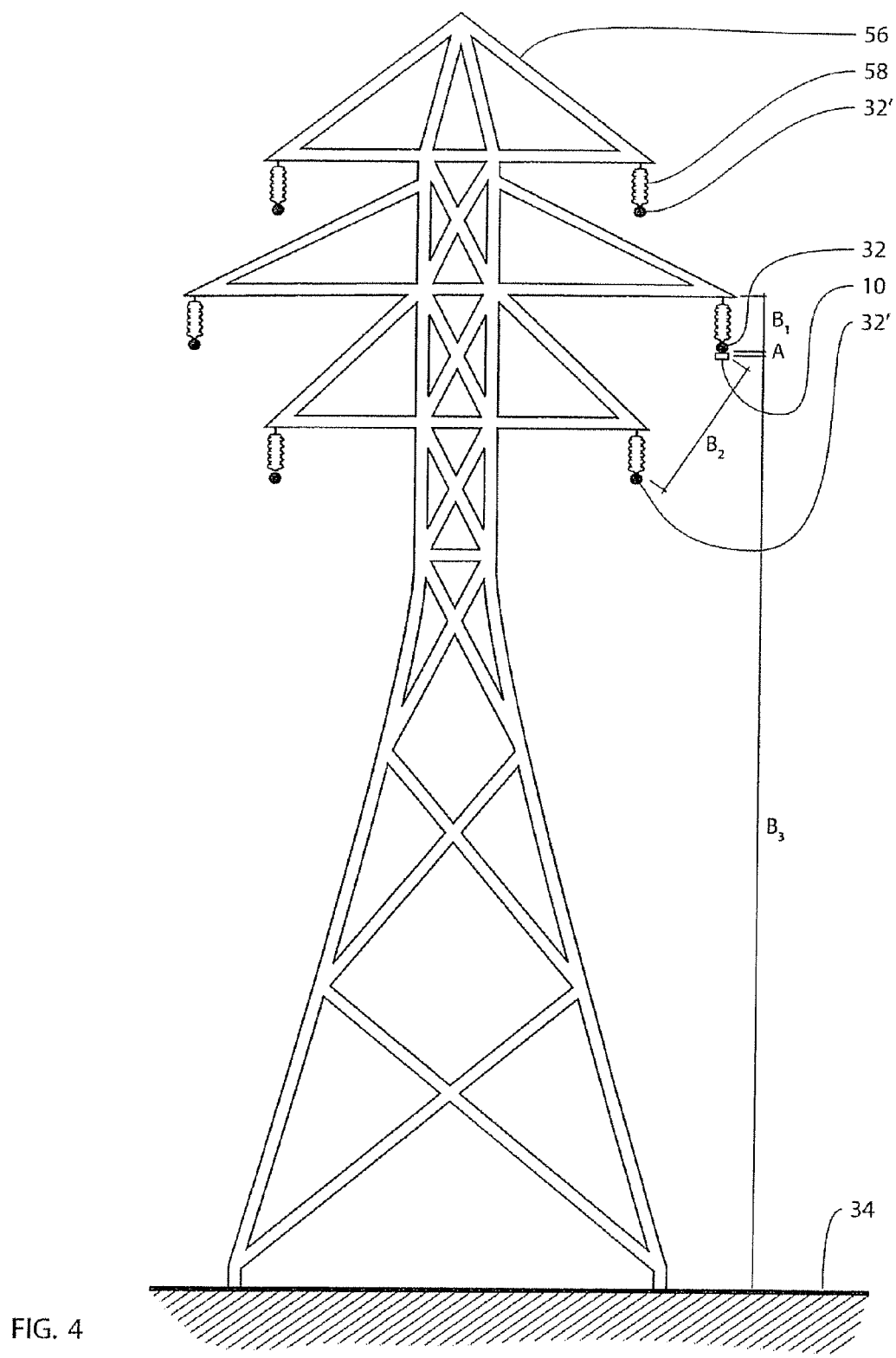
FIG. 4 is a view of a high voltage pylon with voltage sensors in accordance with the present disclosure.

FIG. 4 shows a high voltage pylon 56 including multiple power lines 32, 32', at least some of which operate at different voltages, frequencies and/or phase angles with respect to one another. The design of the pylon shown in FIG. 4 is only to be construed as an example and may vary depending on national and local circumstances. The power lines 32 are separated from the grounded pylon 56 by insulators 58. The electro-optical crystal (not shown) of the voltage sensor 10 defines a minimum distance A to the power line 32. An electric field is established from the power line 32 to the grounded pylon 56, to another power line 32' which operates at another voltage, frequency and/or phase angle, and to the ground 34. The electro-optical crystal (not shown) of the voltage sensor 10 defines a minimum distance B1 to the high voltage pylon 56 which is a ground reference, a minimum distance B2 to another power line 32' which operates at another voltage, frequency and/or phase angle, and a minimum distance B3 to the ground 34 surface on which the high voltage pylon 56 is located. Depending on the situation and location of the voltage sensor 10, any of B1, B2 or B3 may be the minimum distance. Typically, as shown, the voltage sensor 10 is located close to the pylon and preferably near the insulator 58, and the distance B1 will be the minimum distance. However, in case the voltage sensor 10 is located in between two pylons 56, the minimum distance B2 or B3 to either another power line 32' or the ground will be smaller than the minimum distance B1 to the pylon 56.

Figure 5A:
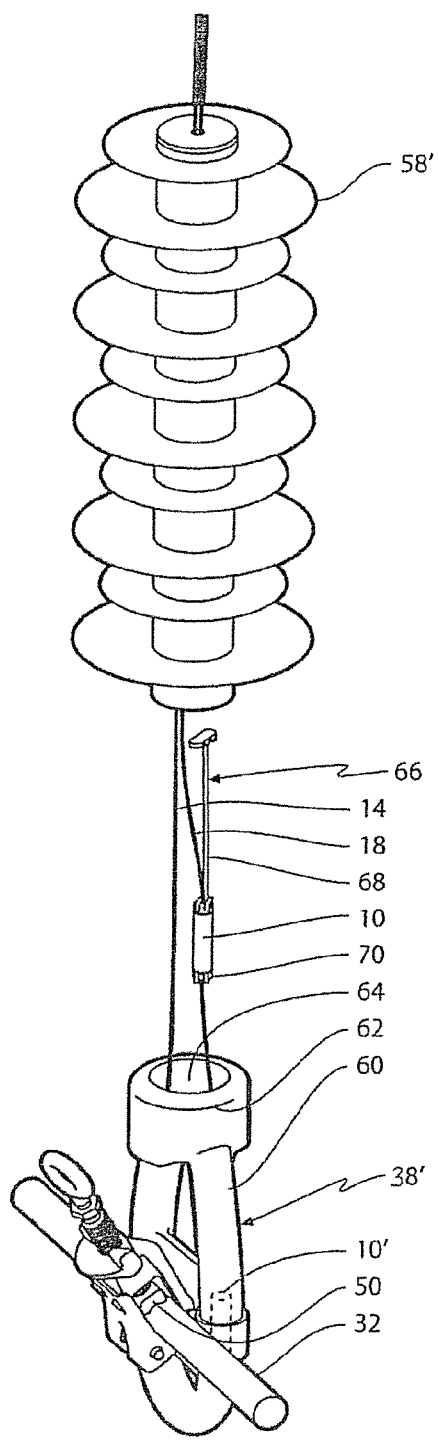
FIG. 5A is a perspective view of an alternative configuration of an assembled power line, voltage sensor, and insulator, in accordance with the present disclosure.

FIG. 5A shows a combined insulator and voltage measurement system. In a special embodiment, a hollow insulator 58' is coupled to a voltage sensor holder 38' made of dielectric material. The voltage sensor holder is in principle similar to the holder 38 of FIG. 3A, but in addition comprises a hollow loop 60 and a hollow cylindrical base 62 attached to the hollow loop 60. The hollow cylindrical base 62 has a circular opening 64 for accessing the inner space defined by the hollow cylindrical base 62 and the hollow loop 60. The hollow loop 60 is attached to the hollow cylindrical base 62 on the closed side opposite the circular opening 64. The voltage sensor holder 38' may be used to fix the current measurement system to the power line 32 in a flexible way. The power line 32 comprises an elongated wire or a set of wires having a diameter of approximately 10 mm. For normal air-insulated overhead applications, the power line 32 does not have any insulating coating. The power line 32 may also comprise a set of thinner wires bundled together. The power line 32 is made of a metal having excellent current-conducting capabilities, typically aluminium, alternatively copper. A spacer 50 made of soft material such as plastic or rubber may be used to avoid direct contact between the holder 38' and the power line 32. The hollow loop 60, the hollow cylindrical base 62 and the holder 38' are made of a dielectric material with sufficient rigidity to withstand many years of outdoors use. Such material may e.g. be a composite polymeric material.

A voltage sensor 10 is located in a specific measurement position 10' (dashed line) inside the hollow loop 60. The voltage sensor comprises a small and elongated cylinder made of plastic material and has a size fitting inside the hollow loop 60. The specific measurement position is defined at a position juxtaposed and perpendicular to the power line 32 so that the electric field lines in the direction of the light beam through the voltage sensor 10 are maximized. The voltage sensor 10 is fixed in the specific measurement position by a fixation part 66. The fixation part 66 comprises a flexible rod 68 and a gripping member 70. The gripping member 70 is attached to the flexible rod 68 and comprises two claws clamping the voltage sensor 10 and holding it in a secure position. The flexible rod 68 is substantially straight in its relaxed state. By positioning the flexible rod 68 inside the hollow loop 60, the flexible rod 68 will assume a substantially bent state, thereby applying a friction force on the inner wall of the hollow loop 60. The distance of the rod 68 will position the voltage sensor 10 in the measurement position. The fibres 14, 18 are accommodated inside the hollow loop 60. The optical fibre has a limited flexibility and may break or be damaged when subject to a high bending force or curvature. The curvature of the hollow loop 60 should not extend the maximum allowed curvature of the optical fibres 14, 18. The fibres 14, 18 are preferably encapsulated in rubber, plastic or the like. The hollow loop 60 must be made of a non-conducting material to prevent it from shielding the sensor 10 from the electric field.

Figure 5B:
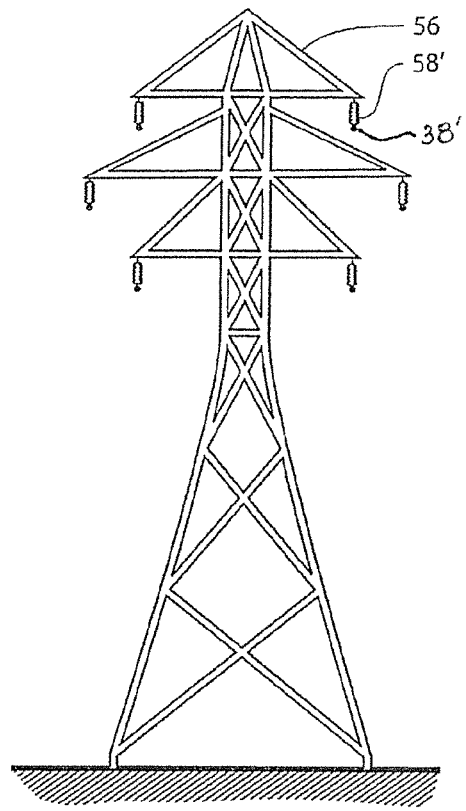
FIG. 5B is a view of a high voltage pylon with assemblies of the type shown in FIG. 5A.

FIG. 5B shows a high voltage pylon 56 including a holder 38' and hollow insulator 58' as described above. The holder 38' is mounted on the hollow insulator 58' so that the optical fibres 14, 18 may be led though the insulator 58'. In this way, the voltage sensor 10 and the optical fibres 14, 18 are well protected from wind and weather. The optical fibres 14, 18 may be led via the pylon 56 to the base of the pylon 56.

FIG. 6A is a cross-sectional view of a second embodiment of a voltage sensor 10" which is particularly adapted for outdoor use. The voltage sensor 10" comprises an oblong housing 16' defining a first and an opposite second end designated 16" and 16''' respectively. At the first end 16" of the housing 16' a first seal 72 is mounted, the first seal 72 having an aperture for receiving a first optical fibre 14'. A first fibre fixture 74 is mounted in the housing 16'. The first fibre fixture 74 has an aperture for receiving the optical fibre 14'. A first optical lens 22' has a first receiving section 76 for receiving the optical fibre 14' and the first fibre fixture 74. A circular polarization filter 26' is mounted in optical continuation of the first optical lens 22'. A crystal rod 28' of electro-optical material is located in optical continuation of the circular polarization filter 26'. At the opposite end of the crystal rod 28' a linear polarization filter 30' is mounted in optical continuation thereof. A second optical lens 24' is mounted in optical continuation of the second polarization filter 30'. The second optical lens 24' includes a second receiving section 78 for receiving a second fibre fixture 80. A second seal 82 having an aperture for receiving a second optical fibre 18' is located in optical continuation of the second fibre fixture 80.

Two optical fibres 14', 18' are inserted through the first and second seals 72, 82 into the first and second fibre fixtures 74, 80, respectively. The optical fibres 14', 18' are mechanically fixed to the housing 16' by means of two sensor lids 84, 86, respectively. The sensor lids 84, 86 fix the fibres 14', 18' and seal the voltage sensor 10".

FIG. 6B is a schematic perspective view of a voltage sensor 10', illustrating a groove 90 in the housing 16' extending parallel to the crystal rod 28'. The groove 90 may have a planar bottom wall or alternatively a rounded bottom wall for improving the fixation of the voltage sensor 10' to an electrical conductor. The groove 90 is incorporated in the housing in order to bring the crystal rod 28' as close to the power line as possible and has the further advantage of fixing the voltage sensor 10' at a 90° angle with respect to the power line. The groove 90 may be of arbitrary length, but is preferably of the same length as the crystal rod 28' or shorter.

FIG. 6C is a schematic perspective view of a voltage sensor 10' illustrating the housing 16' which may further comprise a set of wings 88 for mounting the voltage sensor 10' to a power line by plastic strips or other fastening means. The material used for the housing 16' and lids 84, 86 is preferably a plastic material capable of withstanding temperature ranges from −40 to 150° C. and having electrical insulating properties. The material is preferably non-permeable to light in the 400 to 1000 nm range. Materials having the above-mentioned properties may be plastic materials such as Ultem or Peek. The fixation wings 88 may be incorporated in a geometrical expansion of the groove 90 (not shown).

The optical voltage sensor according to the present invention is very compact and may advantageously be integrated in an optical voltage module (not shown) which generates an analogue voltage over e.g. a CAN bus in an existing LV or MV module. Hence, there is no need for specific changes to existing modules and measurement setups.

Proof of Concept

Figure 7:
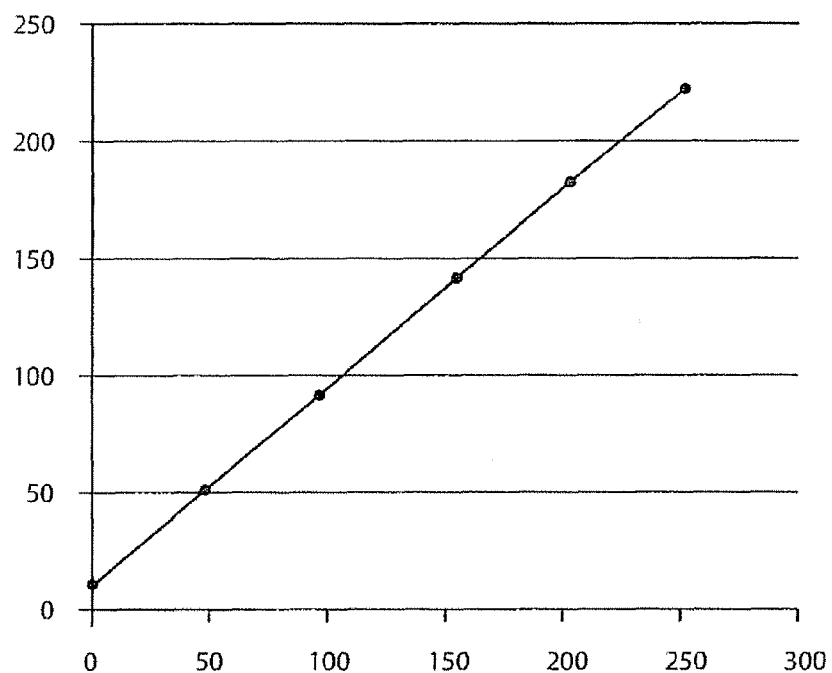
FIGS. 7, 8, and 9 are graphs showing results of experimental uses of the voltage sensor in accordance with the present disclosure.

FIG. 7 shows the results of the first proof of concept experiment. The x-axis is the applied voltage (in volts) and the y-axis is an arbitrary value representing the measurement. In the first experiment, a sensor was built to be compatible with a DISCOS® Opti module, which is a commercially available current measurement module produced by the applicant company. Thus the electronic measurement hardware, as well as the fibres and lenses, are all commercially available. The sensor house, electro-optical glass rod and polarization filters in the normal DISCOS® current sensor were replaced by a different custom-designed voltage sensor.

The first step of the proof of concept was to perform theoretical calculations to check the feasibility of the present system and method. A computer program was made, based on Jones algebra, which program can simulate the polarization state of light passing though different media. The minimum current which is detectable in a commercially available optical current sensor module is approximately 1 A. The simulator was used to calculate the change in light intensity resulting from 1 A AC using the commercially available current sensor module.

Subsequently it was determined which voltage was needed to be applied to a voltage sensor in order to achieve the same light intensity change. The result of the simulation was that a 1V signal from the voltage sensor corresponded to a current signal of 50 A. This means that a minimum voltage of 20 mV is detectable, which is extremely sensitive, considering that the typically voltages within the technical field of power distribution are many kV.

The general setup had the lens with the incoming light from a light-emitting diode entering the sensor in one end. The light then traversed several elements (filters as well as the crystal) before exiting into the other lens which focused the light into the fibre, leading it back to a photo diode. The first filter was a linear polarizer; the next a quarter-wave plate; then the light entered the KD*P crystal and finally a second polarizer (also referred to as the analyzer). Electrodes were also inserted on each side of the crystal, generating an electric field over the crystal parallel to the light trajectory. This is called a longitudinal sensor or longitudinal setup, because the electric field is parallel to the light trajectory.

The first sensor used polaroid filters cut from a sheet similar to the ones used in the current sensor. The half-wave plate used was of extremely high precision and was acquired from the company BBT. The electro-optical crystals were acquired from the company EKSMA. Such crystals may be specifically grown and cut according to specifications. The dimensions of the crystals used were (x,y,z)=(1,1,2) cm, with the z-axis being parallel to the light trajectory. The crystal was cut so that an electric field applied along the z-axis induced a natural axis along the x-axis (thus making it a longitudinal sensor). The electrodes were thin copper plates, each with a hole in the middle to allow the sensor and the light to pass through.

The fibre was connected to the above mentioned DISCOS® Opti module, which is a current sensor, and measurements were taken with a graphical PC tool known as Discman™. The result of the first experiment is shown in the graph in FIG. 7.

As can be seen from FIG. 7, one applied Volt reads almost as one Ampere signal from a current sensor. The results are well within the sensitivity of the equipment used, albeit not quite as good as theoretically predicted when using the above mentioned software. The discrepancy in relation to the theoretically predicted results may be explained by the fact that quite a large amount of light was lost in the filters.

It was discovered that the length of the crystal along the light path was inconsequential, as the increase in retardance due to length was cancelled out by the decrease in the electric field due to the increased distance between the electrodes on either side of the crystal. However, a shorter crystal has other advantages such as reduced loss of light and reduced cost. So the next sensors were made with 5 mm long crystals. Further, it was discovered that modern 3D glasses, such as the ones used in cinemas for viewing 3D movies like the well-known movie Avatar, are in fact circular polarizers. Hence it was possible to replace the first polarizer filter and the expensive quarter-wave plate by a single film cut from such 3D glasses. The polarizing film used in the 3D glasses is also commercially available in the form of sheets.

Figure 8:
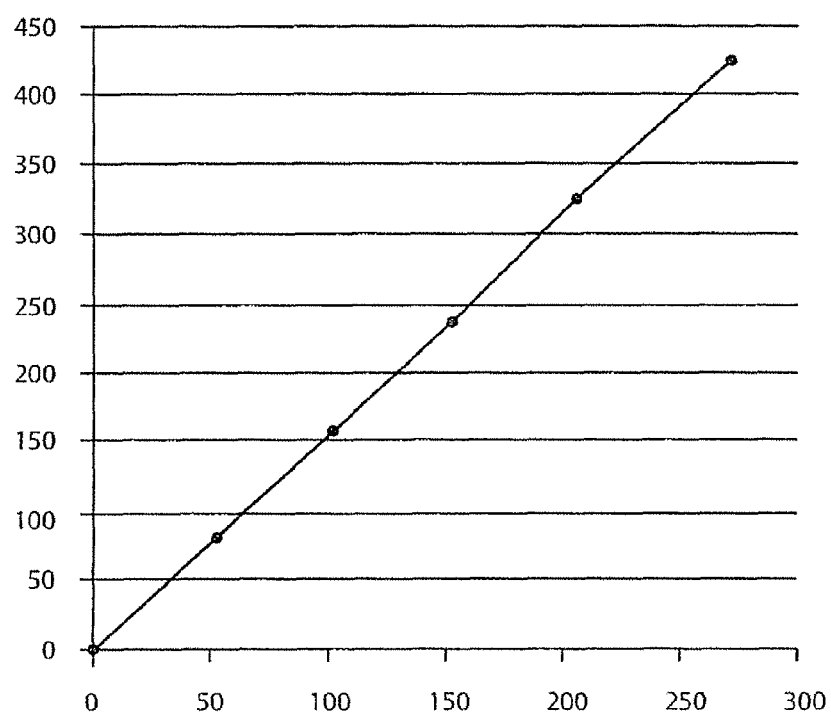

FIG. 8 shows the results of the second proof of concept experiment. The x-axis is the applied voltage and the y-axis is the measurement. In the second experiment, a combined first polarizer filter and quarter-wave plate was used. This resulted in a lower loss of light compared to using a separate polarizer filter and quarter-wave plate.

In order to achieve a maximized E-field over the electro-optical crystal, the voltage should be applied to opposing electrodes located on each side of the crystal and constituting ground and line voltage, respectively. However, any conductor radiates an electric field, and close to the conductor the electric field strength can be quite intensive. Since it is possible to measure a potential drop over the crystal of only a couple of volts, a wire of 10 kV will also be measurable, even though there may be several meters to the nearest ground.

Figure 9:
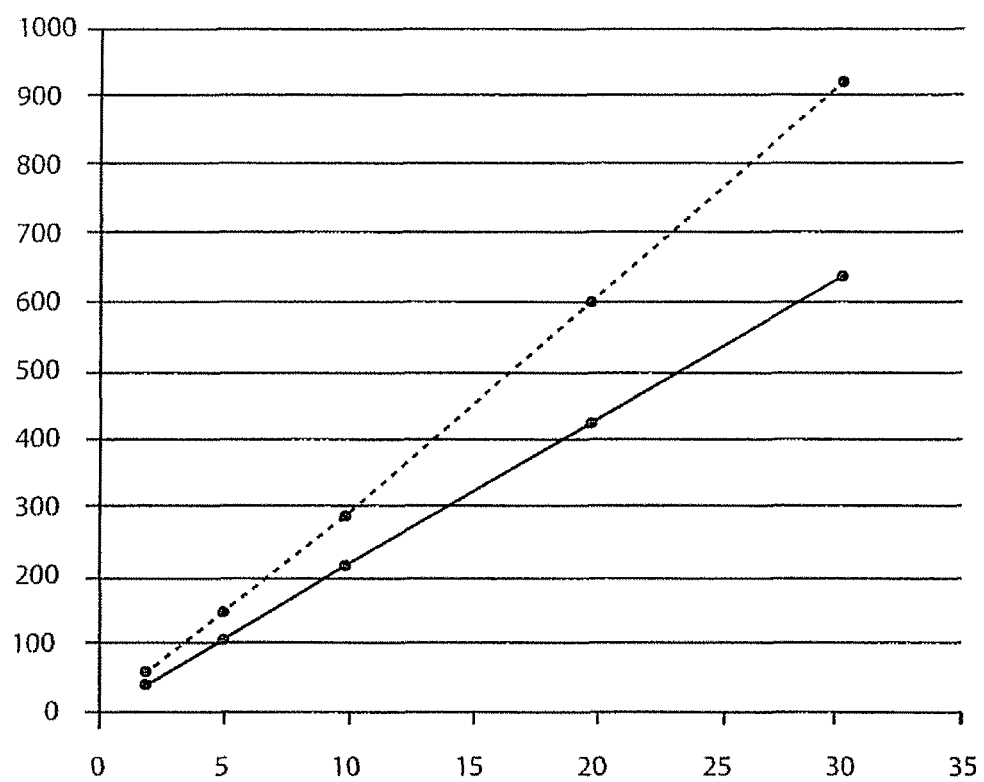

FIG. 9 shows the result of two measurements made very close to the conductor. The x-axis is the applied voltage (in kV) and the y-axis is an arbitrary value representing the measurement. The solid line in FIG. 9 shows the results of a voltage measurement in which the sensor points away from the conductor at a distance of about 2 cm. The results show that the voltage is certainly measureable even in case the ground is located at a distant location. However, this approach makes the voltage sensor more susceptible to the E-field from neighboring phases in a three-phase system, which neighboring phases must of course not influence the measurement. However, the field strength drops proportionally to the reciprocal of the squared distance, and as the neighboring conductor is at least about 100 times further away from the sensor than the conductor to be measured and the field vector of the neighboring phase is typically at an angle to the crystal, the effect of the neighboring phase may be neglected.

The next phase was to build an all-optical combined sensor. For the attempt a standard overhead DISCOS® Outdoor Combined Sensor was used. Two fibres were pulled through the top part of the sensor, one of which went to the current sensor also placed in the top part. The other fibre went all the way through the top part to the voltage sensor which was placed just under the top part. The voltage sensor was placed so that light pointed away from the conductor, which was parallel to the electric field radiated by the conductor. An empty insulating tube was attached to the sensor's bottom, which was a metal plate connected to the ground potential. This created a more powerful and homogeneous field inside the tube (in which the sensor was placed). The result is shown by the dashed line in FIG. 9.

The measurement by the overhead sensor was carried out without the bottom plate being grounded. However, connecting the plate gave only a small change in signal, possibly due to the relatively large length of the tube (28 cm) and thus distance to the grounded bottom. This does give some support to the idea that the close field is indifferent to the far away geometry, thus eliminating the necessity of a ground connection in the sensor, even if there are other phases in the vicinity. Later calculations have confirmed that the close proximity field is in fact almost independent of nearby wires of different potential.

The specifications of the proposed all-optical combined sensor can easiest be described by comparing them to the DISCOS outdoor combined sensor. The specifications of the former are very similar to the latter, with some key differences.

Specification of the prototype:

Voltage range: 100 V-500,000 V. The lower voltage can be as low as about 1 V, but this will require electrodes being attached on either side of the sensor, which will lower the max voltage.

Estimated accuracy: 2%. The variation in light intensity is much like that caused by the current sensor, and the electronics will be very (or maybe exactly) similar, hence the accuracy will likely be about the same.

Material of conductor: preferably aluminum, copper or any other conductive material Operational temperature: −40° C. to 75° C.

Weight: ~500 g

Expected lifetime: 50 years

REFERENCE NUMERALS WITH REFERENCE TO THE FIGURES

10. Voltage sensor/electric field sensor
12. Light source
14. First optical fibre
16. Housing
18. Second optical fibre
20. Photo detector
22. First collimator lens
24. Second collimator lens
26. Circular polarizer
28. Electro-optical crystal
30. Linear polarizer
32. Power line
34. Ground
36. Plate
38. Holder
40. Snap holder
42. Screw holder
44. Threaded rod
45. Hinge
46. Receptacle
48. Handle
50. Spacer
52. Extension 54. Elongated rod
56. High voltage pylon
58. Insulators
60. Loop
62. Base
64. Opening
66. Fixation part
68. Rod
70. Gripping member
72. Sealing member
74. First fixture
76. First reception part
78. Second reception part
80. Second fixture
82. Second sealing member
84. First lid
86. Second lid
88. Wings
90. Groove

The invention claimed is:

1. An AC or DC power transmission system comprising a first electrical conductor, a second electrical conductor and an insulating space between said first electrical conductor and said second electrical conductor, said power transmission system further comprising an electric field measurement device, said electric field measurement device comprising:
   a housing made of dielectric material and defining a first open end and a second open end opposite said first open end;
   a first optical fiber received in said first open end of said housing and configured for connection to a light source;
   a first optical lens mounted in said housing adjacent said first open end and in optical communication with said first optical fiber;
   a circular polarization filter mounted in said housing in optical communication with said first optical lens;
   a crystal rod having electro-optical properties received in and encapsulated within said housing in optical communication with said circular polarization filter;
   a linear polarization filter mounted in said housing in optical communication with said crystal rod;
   a second optical lens mounted in said housing adjacent said second open end in optical communication with said linear polarization filter; and
   a second optical fiber received in said second open end of said housing in optical communication with said second optical lens, said second optical fiber being configured for connection to a light detection unit;
   wherein a continuous light path is defined within said housing from said first optical fiber, through said first optical lens, said circular polarization filter, said crystal rod, said linear polarization filter, and said second optical lens to said second optical fiber; and
   wherein said electric field measurement device is located adjacent to said first electrical conductor within said insulating space so as to define a first minimum distance between said crystal rod and said first electrical conductor and a second minimum distance between said crystal rod and said second electrical conductor, said second minimum distance being at least 10 times larger than said first minimum distance.

2. The power transmission system according to claim 1, wherein said first electrical conductor comprises one of an overhead line and a metallic object electrically connected to an overhead line.

3. The power transmission system according to claim 1, wherein said second electrical conductor comprises a metallic object insulated from said first electrical conductor.

4. The power transmission system according to claim 1, wherein said second electrical conductor constitutes the ground.

5. The power transmission system according to claim 1, wherein said first electrical conductor of said power transmission system has a rated voltage of between 0.1 kV and 1000 kV.

6. The power transmission system according to claim 1, wherein said crystal rod is configured for exposure to an effective electric field strength of between $1*10^4$ V/m and $1.2*10^8$ V/m when said power transmission system is being operated at its rated voltage.

7. The power transmission system according to claim 1, wherein said first minimum distance is between 0.1 mm and 100 mm.

8. The power transmission system according to claim 1, wherein said second minimum distance is between 0.1 m and 100 m.

9. The power transmission system according to claim 1, wherein said crystal rod defines a light path through said crystal rod that is oriented substantially parallel to the electric field at said first conductor.

10. The power transmission system according to claim 1, wherein said crystal rod defines a light path through said crystal rod that is oriented substantially perpendicular to the electric field at said first conductor.

11. The power transmission system according to claim 1, wherein said circular polarization filter comprises a quarter-wave plate and a linear polarizer.

12. The power transmission system according to claim 1, wherein said crystal rod exhibits the Pockels effect.

13. The power transmission system according to claim 12, wherein said crystal rod is made of potassium phosphate.

14. The power transmission system according to claim 1, wherein said electric field measurement device further comprises:
   a first seal at said first end of said housing, said first seal having an aperture configured for receiving said first optical fibre;
   a first fixture configured for fixing said first optical fiber to said housing;
   a first reception part attached to said first optical lens and configured for receiving said first fixture;
   a second fixture configured for fixing said second optical fiber to said housing;
   a second reception part attached to said second optical lens and configured for receiving said second fixture;
   a second seal configured for sealing said second end of said housing, said second seal having an aperture configured for receiving said second optical fiber; and
   a first lid and a second lid fixed to said first and second end, respectively, of said housing, said first lid and said second lid each including an aperture configured for respectively receiving said first optical fiber and said second optical fiber.

15. The power transmission system according to claim 1, wherein said housing is made of a polymeric material.

16. The power transmission system according to claim 1, wherein said insulating space is filled with a gas selected from the group consisting of one or more of $N_2$, $SF_6$, and atmospheric gas.

17. A method of measuring a voltage of a first electrical conductor in relation to a second electrical conductor spaced apart from said first electrical conductor by an insulating space, said method comprising providing an electric field measurement device, said electric field measurement device comprising:
- a housing made of dielectric material and defining a first open end and a second open end opposite said first open end;
- a first optical fiber received in said first open end of said housing and configured for connection to a light source;
- a first optical lens mounted in said housing adjacent said first open end and in optical communication with said first optical fiber;
- a circular polarization filter mounted in said housing in optical communication with said first optical lens;
- a crystal rod having electro-optical properties received in and encapsulated within said housing in optical communication with said circular polarization filter;
- a linear polarization filter mounted in said housing in optical communication with said crystal rod;
- a second optical lens mounted in said housing adjacent said second open end in optical communication with said linear polarization filter; and
- a second optical fiber received in said second open end of said housing in optical communication with said second optical lens, said second optical fiber being configured for connection to a light detection unit;
- wherein a continuous light path is defined within said housing from said first optical fiber, through said first optical lens, said circular polarization filter, said crystal rod, said linear polarization filter, and said second optical lens to said second optical fiber;

said method further comprising the following steps:
- positioning said electric field measurement device adjacent said first electrical conductor within said insulating space so that a first minimum distance defined between said crystal rod and said first electrical conductor is at least 10 times larger than a second minimum distance defined between said crystal rod and said second electrical conductor; and
- detecting a relative retardance between light emitted by said light source and light detected by said light detection unit.

18. A method of calibrating an electric field measurement device included in a power transmission system, said power transmission system comprising a first electrical conductor having a first known voltage, a second electrical conductor having a second known voltage, and an insulating space between said first electrical conductor and said second electrical conductor, said electric field measurement device comprising:
- a housing made of dielectric material and defining a first open end and a second open end opposite said first open end;
- a first optical fiber received in said first open end of said housing and configured for connection to a light source;
- a first optical lens mounted in said housing adjacent said first open end and in optical communication with said first optical fiber;
- a circular polarization filter mounted in said housing in optical communication with said first optical lens;
- a crystal rod having electro-optical properties received in and encapsulated within said housing in optical communication with said circular polarization filter;
- a linear polarization filter mounted in said housing in optical communication with said crystal rod;
- a second optical lens mounted in said housing at said second open end in optical communication with said linear polarization filter; and
- a second optical fiber received in said second open end of said housing in optical communication with said second optical lens, said second optical fiber being configured for connection to a light detection unit;
- wherein a continuous light path is defined within said housing from said first optical fiber, through said first optical lens, said circular polarization filter, said crystal rod, said linear polarization filter, and said second optical lens to said second optical fiber; and
- wherein said electric field measurement device is located adjacent said first electrical conductor within said insulating space so as to define a first minimum distance between said crystal rod and said first electrical conductor and a second minimum distance between said crystal rod and said second electrical conductor, said second minimum distance being at least 10 times larger than said first minimum distance;

said method comprising the steps of:
- detecting a relative retardance between light emitted by said light source and light detected by said light detection unit; and
- calculating a calibration constant based on said relative retardance and said first and second known voltages.

* * * * *